United States Patent
Criniti et al.

(10) Patent No.: US 6,268,991 B1
(45) Date of Patent: Jul. 31, 2001

(54) METHOD AND ARRANGEMENT FOR CUSTOMIZING ELECTRONIC CIRCUIT INTERRUPTERS

(75) Inventors: Joseph Criniti, New Britain; Javier I. Larranaga, Bristol; Lee Wambolt, Colchester; Alan Messerli, Bristol, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/344,753

(22) Filed: Jun. 25, 1999

(51) Int. Cl.[7] .............................. H02H 3/027; B23P 19/00

(52) U.S. Cl. ........................................ 361/93.3; 29/762

(58) Field of Search ................. 361/42–50, 93.1, 361/93.2, 93.3, 93.5, 91.1, 94, 97, 98, 99, 634, 635, 736, 738, 748, 760; 29/832–845, 847, 739, 741, 762, 740, 764

(56) References Cited

U.S. PATENT DOCUMENTS

| | | | |
|---|---|---|---|
| D. 367,265 | 2/1996 | Yamagata et al. | D13/160 |
| 2,340,682 | 2/1944 | Powell | 200/147 |
| 2,719,203 | 9/1955 | Gelzheiser et al. | 200/144 |
| 2,937,254 | 5/1960 | Ericson | 200/114 |
| 3,158,717 | 11/1964 | Jencks et al. | 200/116 |
| 3,162,739 | 12/1964 | Klein et al. | 200/88 |
| 3,197,582 | 7/1965 | Norden | 200/50 |
| 3,307,002 | 2/1967 | Cooper | 200/116 |
| 3,517,356 | 6/1970 | Hanafusa | 335/16 |
| 3,631,369 | 12/1971 | Menocal | 337/110 |
| 3,676,746 | 7/1972 | Kassabgi et al. | 361/796 |
| 3,803,455 | 4/1974 | Willard | 317/33 SC |
| 3,883,781 | 5/1975 | Cotton | 317/14 R |
| 4,034,202 | * 7/1977 | Vandermark | 29/764 |
| 4,129,762 | 12/1978 | Bruchet | 200/153 G |
| 4,144,513 | 3/1979 | Shafer et al. | 335/46 |
| 4,158,119 | 6/1979 | Krakik | 200/240 |
| 4,165,453 | 8/1979 | Hennemann | 200/153 G |
| 4,166,988 | 9/1979 | Ciarcia et al. | 335/9 |
| 4,220,934 | 9/1980 | Wafer et al. | 335/16 |
| 4,255,732 | 3/1981 | Wafer et al. | 335/16 |
| 4,259,651 | 3/1981 | Yamat | 335/16 |
| 4,263,492 | 4/1981 | Maier et al. | 200/288 |
| 4,276,527 | 6/1981 | Gerber-Gaillard et al. | 335/39 |
| 4,297,663 | 10/1981 | Seymour et al. | 335/20 |
| 4,301,342 | 11/1981 | Castonguay et al. | 200/153 SC |
| 4,360,852 | 11/1982 | Gilmore | 361/98 |
| 4,368,444 | 1/1983 | Preuss et al. | 335/166 |
| 4,375,021 | 2/1983 | Pardini et al. | 200/147 B |
| 4,375,022 | 2/1983 | Daussin et al. | 200/148 R |
| 4,376,270 | 3/1983 | Staffen | 335/21 |
| 4,383,146 | 5/1983 | Bur | 200/17 R |
| 4,392,036 | 7/1983 | Troebel et al. | 200/322 |
| 4,393,283 | 7/1983 | Masuda | 200/51.09 |
| 4,401,872 | 8/1983 | Boichot-Castagne et al. | 200/153 G |
| 4,409,573 | 10/1983 | DiMarco et al. | 335/16 |
| 4,435,690 | 3/1984 | Link et al. | 335/37 |
| 4,467,297 | 8/1984 | Boichot-Castagne et al. | 335/8 |
| 4,468,645 | 8/1984 | Gerbert-Gaillard et al. | 335/42 |

(List continued on next page.)

FOREIGN PATENT DOCUMENTS

| | | | |
|---|---|---|---|
| 897 691 | of 0000 | (BE) | H02H/3/10 |
| 819 008 | 12/1974 | (BE) | H02H/3/26 |
| 12 27 978 | 11/1966 | (DE) | H01H/3/00 |

(List continued on next page.)

*Primary Examiner*—Ronald W. Leja
(74) *Attorney, Agent, or Firm*—Cantor Colburn LLP; Carl B. Horton

(57) ABSTRACT

An electronic circuit interruption device having a plurality of protection, indication and control options includes a dedicated printed circuit board having electrical connection with operating circuits controlling each of the several options. Electrical connections between the operating circuits and the circuit interruption controller is made through corresponding dedicated resistors. Option selection is obtained by removal of resistors connecting with non-selected circuits on the printed circuit board.

11 Claims, 4 Drawing Sheets

U.S. PATENT DOCUMENTS

| | | | |
|---|---|---|---|
| 4,470,027 | 9/1984 | Link et al. | 335/16 |
| 4,479,143 | 10/1984 | Watanabe et al. | 358/44 |
| 4,488,133 | 12/1984 | McClellan et al. | 335/16 |
| 4,492,941 | 1/1985 | Nagel | 335/13 |
| 4,541,032 | 9/1985 | Schwab | 361/331 |
| 4,546,224 | 10/1985 | Mostosi | 200/153 G |
| 4,550,360 | 10/1985 | Dougherty | 361/93 |
| 4,562,419 | 12/1985 | Preuss et al. | 335/195 |
| 4,589,052 | 5/1986 | Dougherty | 361/94 |
| 4,595,812 | 6/1986 | Tamaru et al. | 200/307 |
| 4,611,187 | 9/1986 | Banfi | 335/16 |
| 4,612,430 | 9/1986 | Sloan et al. | 200/327 |
| 4,616,198 | 10/1986 | Pardini | 335/16 |
| 4,622,444 | 11/1986 | Kandatsu et al. | 200/303 |
| 4,631,625 | 12/1986 | Alexander et al. | 361/94 |
| 4,642,431 | 2/1987 | Tedesco et al. | 200/153 G |
| 4,644,438 | 2/1987 | Puccinelli et al. | 361/75 |
| 4,649,247 | 3/1987 | Preuss et al. | 200/244 |
| 4,658,322 | 4/1987 | Rivera | 361/37 |
| 4,670,977 | 6/1987 | Scrantom et al. | 29/741 |
| 4,672,501 | 6/1987 | Bilac et al. | 361/96 |
| 4,675,481 | 6/1987 | Markowski et al. | 200/144 R |
| 4,682,264 | 7/1987 | Demeyer | 361/96 |
| 4,689,712 | 8/1987 | Demeyer | 361/96 |
| 4,694,373 | 9/1987 | Demeyer | 361/96 |
| 4,710,845 | 12/1987 | Demeyer | 361/96 |
| 4,717,985 | 1/1988 | Demeyer | 361/96 |
| 4,733,211 | 3/1988 | Castonguay et al. | 335/192 |
| 4,733,321 | 3/1988 | Lindeperg | 361/96 |
| 4,764,650 | 8/1988 | Bur et al. | 200/153 G |
| 4,768,007 | 8/1988 | Mertz et al. | 335/202 |
| 4,780,786 | 10/1988 | Weynachter et al. | 361/87 |
| 4,788,620 * | 11/1988 | Scott | 361/96 |
| 4,831,221 | 5/1989 | Yu et al. | 200/553 |
| 4,870,531 | 9/1989 | Danek | 361/93 |
| 4,884,047 | 11/1989 | Baginski et al. | 335/10 |
| 4,884,164 | 11/1989 | Dziura et al. | 361/97 |
| 4,893,931 | 11/1989 | Batteux et al. | 200/148 R |
| 4,900,882 | 2/1990 | Bernard et al. | 200/147 R |
| 4,910,485 | 3/1990 | Bolongeat-Mobleu et al. | 335/195 |
| 4,914,541 | 4/1990 | Tripodi et al. | 361/94 |
| 4,916,420 | 4/1990 | Bartolo et al. | 335/172 |
| 4,916,421 | 4/1990 | Pardini et al. | 335/185 |
| 4,926,282 | 5/1990 | McGhie | 361/102 |
| 4,935,590 | 6/1990 | Malkin et al. | 200/148 A |
| 4,937,706 | 6/1990 | Schueller et al. | 361/396 |
| 4,939,492 | 7/1990 | Raso et al. | 335/42 |
| 4,943,691 | 7/1990 | Mertz et al. | 200/151 |
| 4,943,888 | 7/1990 | Jacob et al. | 361/96 |
| 4,950,855 | 8/1990 | Bolonegeat-Mobleu et al. | 200/148 A |
| 4,951,019 | 8/1990 | Gala | 335/166 |
| 4,952,897 | 8/1990 | Barnel et al. | 335/147 |
| 4,958,135 | 9/1990 | Baginski et al. | 335/8 |
| 4,965,543 | 10/1990 | Batteux | 335/174 |
| 4,983,788 | 1/1991 | Pardini | 200/16 R |
| 5,001,313 | 3/1991 | Leclerq et al. | 200/148 B |
| 5,004,878 | 4/1991 | Seymour et al. | 200/144 R |
| 5,029,301 | 7/1991 | Nebon et al. | 335/16 |
| 5,030,804 | 7/1991 | Abri | 200/323 |
| 5,057,655 | 10/1991 | Kersusan et al. | 200/148 B |
| 5,077,627 | 12/1991 | Fraisse | 361/93 |
| 5,083,081 | 1/1992 | Barrault et al. | 324/126 |
| 5,095,183 | 3/1992 | Raphard et al. | 200/148 A |
| 5,103,198 | 4/1992 | Morel et al. | 335/6 |
| 5,115,371 | 5/1992 | Tripodi | 361/106 |
| 5,120,921 | 6/1992 | DiMarco et al. | 200/401 |
| 5,132,865 | 7/1992 | Mertz et al. | 361/6 |
| 5,138,121 | 8/1992 | Streich et al. | 200/293 |
| 5,140,115 | 8/1992 | Morris | 200/308 |
| 5,153,802 | 10/1992 | Mertz et al. | 361/18 |
| 5,155,315 | 10/1992 | Malkin et al. | 200/148 R |
| 5,166,483 | 11/1992 | Kersusan et al. | 200/144 A |
| 5,172,087 | 12/1992 | Castonguay et al. | 335/160 |
| 5,178,504 | 1/1993 | Falchi | 411/553 |
| 5,184,717 | 2/1993 | Chou et al. | 200/401 |
| 5,187,339 | 2/1993 | Lissandrin | 200/148 F |
| 5,198,956 | 3/1993 | Dvorak | 361/106 |
| 5,200,724 | 4/1993 | Gula et al. | 335/166 |
| 5,210,385 | 5/1993 | Morel et al. | 200/146 R |
| 5,239,150 | 8/1993 | Bolongeat-Mobleu et al. | 200/148 R |
| 5,260,533 | 11/1993 | Livesey et al. | 200/401 |
| 5,262,744 | 11/1993 | Arnold et al. | 335/8 |
| 5,280,144 | 1/1994 | Bolongeat-Mobleu et al. | 200/148 R |
| 5,281,776 | 1/1994 | Morel et al. | 200/144 |
| 5,296,660 | 3/1994 | Morel et al. | 200/146 R |
| 5,296,664 | 3/1994 | Crookston et al. | 200/401 |
| 5,298,874 | 3/1994 | Morel et al. | 335/8 |
| 5,300,907 | 4/1994 | Nereau et al. | 335/172 |
| 5,310,971 | 5/1994 | Vial et al. | 200/244 |
| 5,313,180 | 5/1994 | Vial et al. | 335/16 |
| 5,317,471 | 5/1994 | Izoard et al. | 361/105 |
| 5,331,500 | 7/1994 | Corcoles et al. | 361/93 |
| 5,334,808 | 8/1994 | Bur et al. | 200/50 |
| 5,341,191 | 8/1994 | Crookston et al. | 335/16 |
| 5,347,096 | 9/1994 | Bolongeat-Mobleu et al. | 20/148 B |
| 5,347,097 | 9/1994 | Bolongeat-Mobleu et al. | 200/148 B |
| 5,350,892 | 9/1994 | Rozier | 200/144 B |
| 5,357,066 | 10/1994 | Morel et al. | 200/17 R |
| 5,357,068 | 10/1994 | Rozier | 200/148 R |
| 5,357,394 | 10/1994 | Piney | 361/72 |
| 5,361,052 | 11/1994 | Ferullo et al. | 335/172 |
| 5,373,130 | 12/1994 | Barrault et al. | 200/147 R |
| 5,379,013 | 1/1995 | Coudert | 335/17 |
| 5,424,701 | 6/1995 | Castonguary et al. | 335/172 |
| 5,438,176 | 8/1995 | Bonnardel et al. | 200/400 |
| 5,440,088 | 8/1995 | Coudert et al. | 200/303 |
| 5,449,871 | 9/1995 | Batteux et al. | 200/401 |
| 5,450,048 | 9/1995 | Leger et al. | 335/132 |
| 5,451,729 | 9/1995 | Onderka et al. | 200/18 |
| 5,457,295 | 10/1995 | Tanibe et al. | 200/293 |
| 5,467,069 | 11/1995 | Payet-Burin et al. | 335/42 |
| 5,469,121 | 11/1995 | Payet-Burin | 335/16 |
| 5,475,558 | 12/1995 | Barjonnet et al. | 361/64 |
| 5,477,016 | 12/1995 | Baginski et al. | 200/43.11 |
| 5,479,143 | 12/1995 | Payet-Burin | 335/202 |
| 5,483,212 | 1/1996 | Lankutis et al. | 335/132 |
| 5,485,343 | 1/1996 | Santos et al. | 361/115 |
| 5,493,083 | 2/1996 | Olivier | 200/17 R |
| 5,500,781 | 3/1996 | Santos et al. | 361/96 |
| 5,504,284 | 4/1996 | Lazareth et al. | 200/50 R |
| 5,504,290 | 4/1996 | Baginski et al. | 200/401 |
| 5,510,761 | 4/1996 | Boder et al. | 335/172 |
| 5,512,720 | 4/1996 | Coudert et al. | 200/400 |
| 5,515,018 | 5/1996 | DiMarco et al. | 335/16 |
| 5,519,561 | 5/1996 | Mrenna et al. | 361/105 |
| 5,534,674 | 7/1996 | Steffens | 218/154 |
| 5,534,832 | 7/1996 | Duchemin et al. | 335/16 |
| 5,534,835 | 7/1996 | McColloch et al. | 335/172 |
| 5,534,840 | 7/1996 | Cuingnet | 337/1 |
| 5,539,168 | 7/1996 | Linzenich | 200/303 |
| 5,543,595 | 8/1996 | Mader et al. | 200/401 |
| 5,552,755 | 9/1996 | Fello et al. | 335/18 |
| 5,581,219 | 12/1996 | Nozawa et al. | 335/132 |
| 5,604,656 | 2/1997 | Derrick et al. | 361/187 |
| 5,608,367 | 3/1997 | Zoller et al. | 335/132 |
| 5,784,233 | 7/1998 | Bastard et al. | 361/36 |

FOREIGN PATENT DOCUMENTS

| | | | |
|---|---|---|---|
| 30 47 360 | 6/1982 | (DE) | H01H/85/20 |
| 38 02 184 | 8/1989 | (DE) | H01H/3/46 |

| | | | | | | | |
|---|---|---|---|---|---|---|---|
| 38 43 277 | 6/1990 | (DE) | H02H/3/08 | 0 394 144 | 10/1990 | (EP) | H01H/71/46 |
| 44 19 240 | 1/1995 | (DE) | H01H/9/10 | 0 394 922 | 10/1990 | (EP) | H01H/1/20 |
| 0 061 092 | 9/1982 | (EP) | G03G/5/14 | 0 399 282 | 11/1990 | (EP) | H01H/73/04 |
| 0 064 906 | 11/1982 | (EP) | H01H/71/74 | 0 407 310 | 1/1991 | (EP) | H02H/3/347 |
| 0 066 486 | 12/1982 | (EP) | H01H/71/52 | 0 452 230 | 10/1991 | (EP) | H01H/71/50 |
| 0 076 719 | 4/1983 | (EP) | H01H/71/74 | 0 555 158 | 8/1993 | (EP) | H01H/71/52 |
| 0 117 094 | 8/1984 | (EP) | H01H/71/10 | 0 560 697 | 9/1993 | (EP) | H01H/77/10 |
| 0 140 761 | 5/1985 | (EP) | H01H/71/52 | 0 567 416 | 10/1993 | (EP) | H01H/9/26 |
| 0 174 904 | 3/1986 | (EP) | H01H/1/20 | 0 595 730 | 5/1994 | (EP) | H01H/71/08 |
| 0 196 241 | 10/1986 | (EP) | H01H/71/00 | 0 619 591 | 10/1994 | (EP) | H01H/71/40 |
| 2 584 877 A1 | 1/1987 | (EP) | H02H/3/08 | 0 665 569 | 8/1995 | (EP) | H01H/83/22 |
| 0 224 396 | 6/1987 | (EP) | H01H/71/52 | 0 693 812 A1 | 1/1996 | (EP) | H02H/3/00 |
| 0 235 479 | 9/1987 | (EP) | H02H/3/04 | 0 700 140 | 3/1996 | (EP) | H02H/3/33 |
| 0 239 460 | 9/1987 | (EP) | H01H/33/24 | WO 97/12714 A2 | 4/1997 | (EP) | B23K/1/018 |
| 0 258 090 | 3/1988 | (EP) | H02H/7/22 | 0 889 498 | 1/1999 | (EP) | H01H/73/04 |
| 0 264 313 | 4/1988 | (EP) | H01H/83/04 | 2 410 353 | 6/1979 | (FR) | H01H/51/24 |
| 0 264 314 | 4/1988 | (EP) | H01H/83/00 | 2 512 582 | 3/1983 | (FR) | F16B/41/00 |
| 0 283 189 | 9/1988 | (EP) | H02B/13/02 | 2 553 943 | 4/1985 | (FR) | H02H/3/33 |
| 0 283 358 | 9/1988 | (EP) | H02H/3/10 | 2 592 998 | 7/1987 | (FR) | H02H/3/04 |
| 0 291 374 | 11/1988 | (EP) | H01H/83/20 | 2 682 531 | 4/1993 | (FR) | H01H/71/10 |
| 0 295 155 | 12/1988 | (EP) | H01H/83/20 | 2 697 670 | 5/1994 | (FR) | H01H/51/27 |
| 0 295 158 | 12/1988 | (EP) | H01H/71/52 | 2 699 324 | 6/1994 | (FR) | H01H/71/10 |
| 0 309 923 | 4/1989 | (EP) | H01H/77/10 | 2 714 771 | 7/1995 | (FR) | H02H/7/045 |
| 0 313 106 | 4/1989 | (EP) | H02B/13/02 | 2 233 155 | 1/1991 | (GB) | H01H/77/10 |
| 0 313 422 | 4/1989 | (EP) | H02H/1/00 | 1 227 978 | 1/1984 | (RU) | G01N/3/30 |
| 0 314 540 | 5/1989 | (EP) | H01H/1/20 | 92/00598 | 1/1992 | (WO) | H01H/1/20 |
| 0 331 586 | 9/1989 | (EP) | H01H/83/20 | 92/05649 | 4/1992 | (WO) | H04M/1/00 |
| 0 337 900 | 10/1989 | (EP) | H01H/71/32 | 94/00901 | 1/1994 | (WO) | H02H/5/04 |
| 0 342 133 | 11/1989 | (EP) | H01H/71/50 | | | | |
| 0 367 690 | 5/1990 | (EP) | H02H/3/04 | | | | |
| 0 371 887 | 6/1990 | (EP) | H01H/71/10 | | | | |
| 0 375 568 | 6/1990 | (EP) | H01H/71/02 | | | | |

* cited by examiner

METHOD AND ARRANGEMENT FOR CUSTOMIZING ELECTRONIC CIRCUIT INTERRUPTERS

BACKGROUND OF THE INVENTION

This invention relates to circuit breakers, and, more particularly, to a method and arrangement for customizing electronic circuit interrupters.

Multifunctional electronic circuit interrupters, such as described in U.S. Pat. No. 4,672,501 entitled Circuit Breaker and Protective Relay Unit, are capable of providing a plurality of optional protection functions, such undervoltage, overvoltage, phase loss, phase imbalance as well as remote control and indication functions, such as shunt trip, bell alarms and the like. Most commercial applications using such circuit interrupters do not require all the accessory functions and options, such that the circuit interrupters are usually customized for each specific function.

U.S. Pat. No. 5,500,781 entitled Digital Circuit Interrupter with Multiple Accessory Function, describes the use of selection switches that allow factory as well as field selection of the preferred protection and accessory options. Normally-open switches connect through OR logic gates with options circuits, allowing the selected functions to become operational through selected switch closure. This manual selection arrangement is sufficient when a limited number of circuit interrupters are employed.

The automatic insertion of electronic components within printed circuit boards in a high speed manufacturing process is described within U.S. Pat. No. 3,676,746 entitled Compatible Modular Circuit Board Connector, and U.S. Pat. No. 4,670,977 entitled Inserter Device for Electronic Components.

SUMMARY OF THE INVENTION

In an exemplary embodiment of the invention, an electronic circuit interruption device having a plurality of protection, indication and control options includes a dedicated printed circuit board having electrical connection with operating circuits controlling each of the several options. Electrical connections between the operating circuits and the circuit interruption controller are made through corresponding dedicated resistors. The resistors are arranged at a predetermined edge of the printed circuit board for access by means of an arbor tool sized to overlay the resistors for removal thereof without interfering with the circuit board substrate. Option selection is obtained by removal of resistors connecting with non-selected circuits on the printed circuit board. Logic is provided to the arbor by a computer-controlled stepper motor. When large numbers of circuit interrupters require specific protection, indication and control options, selection using the method of the present invention can be made early in the circuit interrupter manufacturing process at substantial cost savings over the prior art.

DESCRIPTION OF THE PREFERRED EMBODIMENT

Figure 1:
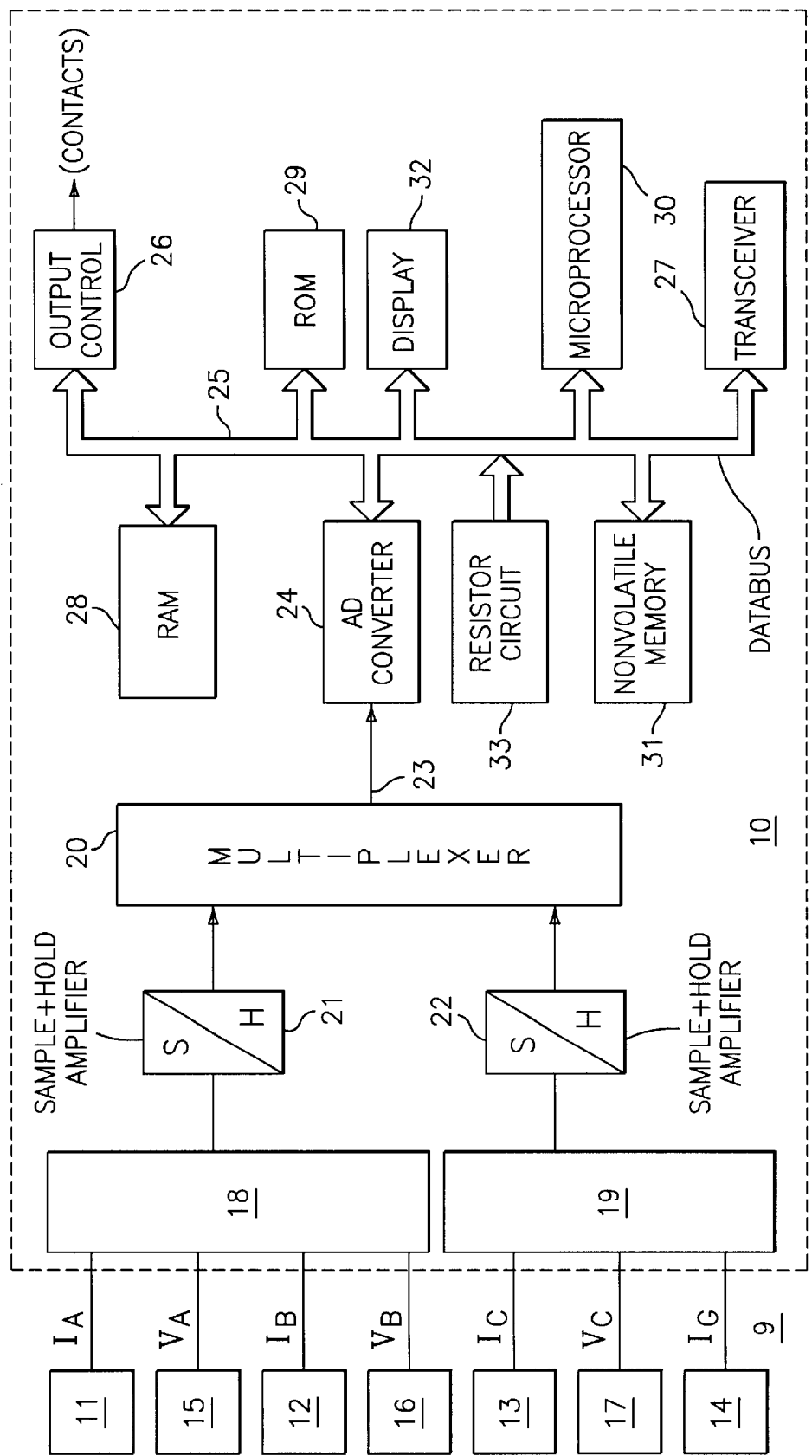
FIG. 1 is a diagrammatic representation of an electronic trip unit employing the trip unit calibration system according to the invention.

Referring to FIG. 1 and as described in the aforementioned U.S. Pat. No. 4,672,501 (which is incorporated by reference), a circuit breaker trip unit 10 is shown. Trip unit 10 has external connections to current transformers 11–14 and potential transformers 15–17. The electrical input is transmitted through multiplexers 18–20 and sample and hold amplifiers 21, 22 to an A/D (analog-to-digital) converter 24 by a conductor 23. Circuit protection and control is achieved by utilization of a data bus 25 which is interconnected with an output control 26, transceiver 27, and RAM (random access memory) 28. The ROM (read only memory) 29, microprocessor 30 and NVM (non-volatile memory) 31 operate in the manner described therein to insure complete overall circuit protection. The information as to the status of the circuit breaker contacts (not shown) that are controlled by the output control 26 is displayed at a display 32. In accordance with the invention, the microprocessor 30 is provided with a resistor circuit 33 that allow selection of the circuit breaker ampere rating and other optional functions. Other functions available to the microprocessor for selection during the assembly of the circuit breaker trip unit 10 include undervoltage and overvoltage determination, shunt trip, bell alarm accessories and the like.

Figure 2:
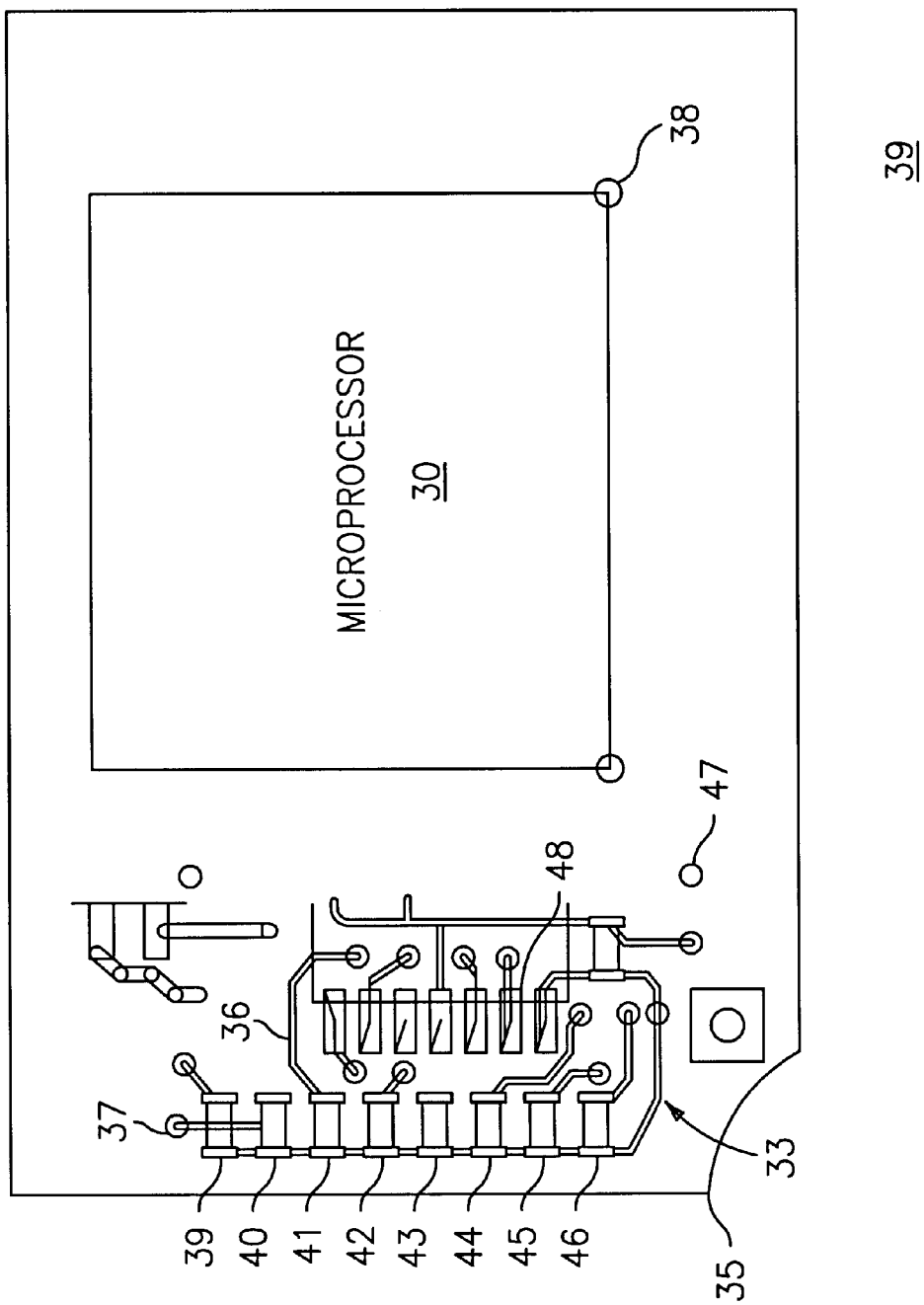
FIG. 2 is a block diagram of a part of the microprocessor circuit within the electronic trip unit of FIG. 1.
Figure 4:
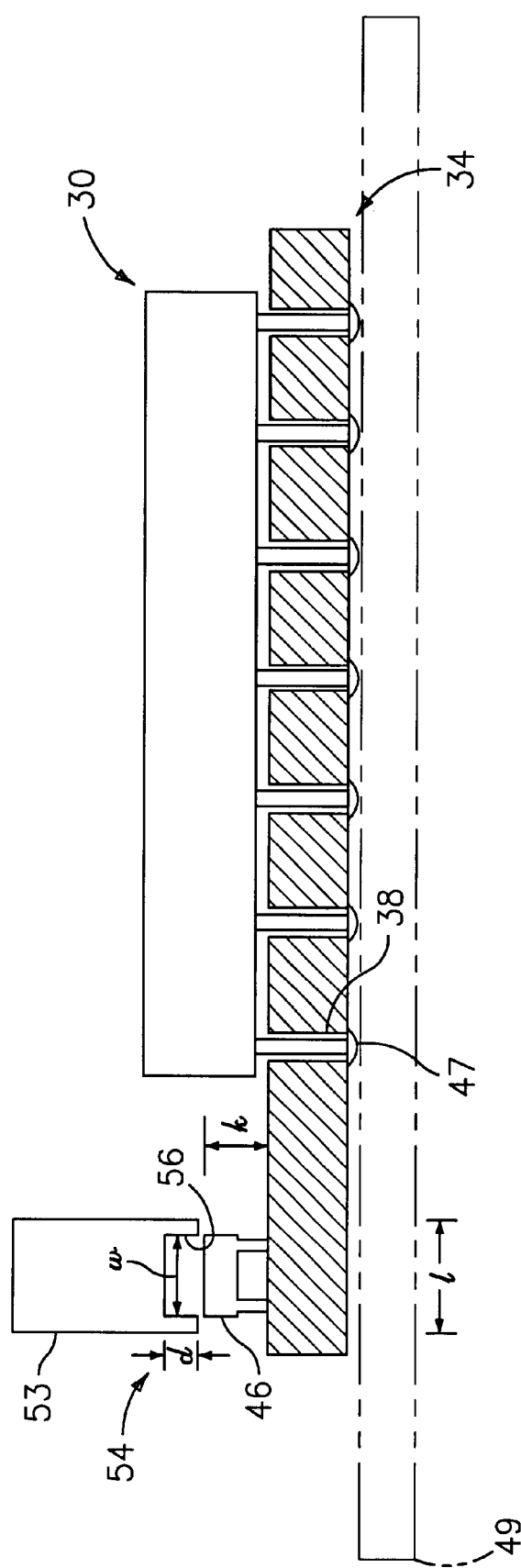
FIG. 4 is an enlarged side view of the cutting tool used with the trip unit calibration apparatus of FIG. 3.

The microprocessor 30 is shown in FIG. 2 mounted to a printed circuit board 34, in the form of a glass-filled fiber board 35 by pins 38 that extend through apertures, such as depicted at 47 which are then solder-filled to provide electrical connections as depicted at 37, as is known in the art. As is common with most printed circuit connections, fuses 48 and conductive rails 36 are integrally-formed on the surface of the printed circuit board to facilitate connection with and to protect the printed circuit board components. In an exemplary embodiment of the invention, a resistor circuit 33 with resistors 39–46 aligned in array format, has each resistor extending upwards from the printed circuit board. Rating and option selection is accomplished by removing selected resistors 39–46 that connect with the microprocessor by means of rail electrical connections with pins 38 that extend from the microprocessor on the opposite side of the printed circuit board (FIG. 4). As described hereinbefore, the resistor circuit 33 connects with the microprocessor 30 by means of the databus 25 (FIG. 1) such that the presence of selected ones of the resistors 39–46 is determined by the microprocessor allowing the circuits associated with the selected resistors to become activated.

Figure 3:
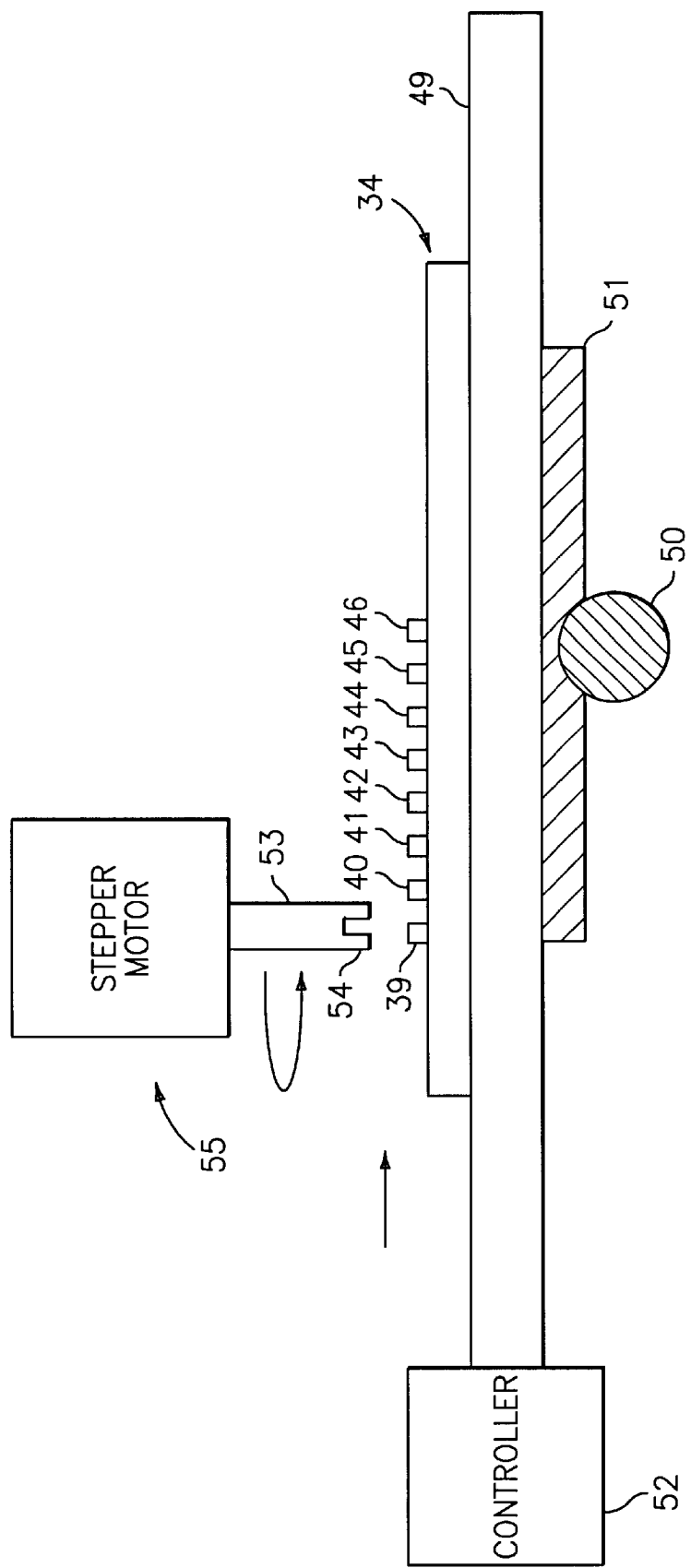
FIG. 3 is a side view of the apparatus used with the trip unit calibration system according to the invention.

Customization of electronic trip unit 10 is achieved by removing selected ones of the resistors 39–46 (FIG. 3) using a transfer table 49 driven by a gear 50 and a drive train 51 under command of a controller 52. One such arrangement is a type GRMTR servo-motor obtained from Pitman Co. The printed circuit board 34 is arranged edgewise on the top of the transfer table with the resistor array parallel with the travel direction of the transfer table, as indicated. A stepper motor 55 is programmed for removing specific one(s) of the resistors 39–46, depending upon the selected rating or functions. The arbor 53 operatively connects with the stepper motor and terminates at the opposite end in a formed tool, as indicated at 54.

The removal of selected one(s) of the resistors is best understood by now referring to FIG. 4 wherein the printed circuit board 34 (FIG. 2) is shown positioned on the transfer table 49, shown in phantom with the microprocessor 30 attached to the printed circuit board by connection of the pins 38, extending from the bottom, within the printed circuit board apertures 47. An important feature of the invention is the arrangement of the tool 54 at the end of the arbor 53 relative to the selected resistor 46, for example from resistor circuit 33 (FIG. 2). The selected resistor 46 is of cylinder configuration and extends a distance "h" upwards from the printed circuit board 34. A slot 56, within the tool 54, is configured a width "w" for clearance of the length "l" of the selected resistor 46 and the depth "d" of the slot 56 is configured for clearance of the distance "h" whereby the selected resistor 46 is broken (cut) away by the twisting action of tool 54 without contact with or damage to the top surface of the printed circuit board 34.

An arrangement has been shown herein for automatic selection of a circuit breaker printed circuit board ampere rating along with circuit breaker accessory options. Resistors are assigned to the particular ratings and options for reading by the microprocessor within the trip unit circuit. Removal of particular one(s) of the resistors at the time of manufacture results in a plurality of trip units having the selected ratings and functions within an automated process at a minimum of time and expense.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention may not be limited to the particular embodiment disclosed as the best mode contemplated for carrying out this invention, but that the invention will include all embodiments falling within the scope of the appended claims.

What is claimed is:

1. A method for selecting circuits on a multi-circuit printed circuit board, the method comprising:
   providing a printed circuit board having a plurality of circuits connecting with a corresponding plurality of associated resistors, each of said circuits defining a particular function;
   connecting said associated resistors and said circuits with a processor; and
   removing a portion from selected resistors from said circuit board for electrically disconnecting selected functions from said printed circuit board, wherein said removing said portions from said resistors utilizes a stepper motor driven arbor having a formed tool at one end thereof.

2. The method of claim 1 wherein said formed tool comprises an enclosure having a top and bottom with an opening extending through said bottom, said opening providing clearance for a selected resistor.

3. The method of claim 2 wherein said bottom defines clearance between said opening and a top of said printed circuit board.

4. The method of claim 1 wherein said removing said portions comprises twisting said selected resistors from said circuit board.

5. An apparatus for selecting circuits on a multi-circuit printed circuit board, the apparatus comprising:
   an arbor having a first end and a second end;
   a tool disposed on said first end, said tool having a slot formed therein for receiving a portion of a resistor which is a component of a circuit on the printed circuit board; and
   a motor operably connected to said second end, said motor for rotating said arbor.

6. The apparatus of claim 5, wherein said motor is a stepper motor.

7. The apparatus of claim 5, further comprising:
   a transfer table positioned proximate to said tool, said transfer table supporting the circuit board.

8. A method for removing portions of respective resistors from circuits located on a circuit board for electrically disconnecting selected functions from the circuit board, the method comprising:
   arranging an end of an arbor proximate to the resistor, and
   twisting the arbor to remove a portion of the resistor.

9. The method of claim 8, further comprising:
   securing an opposite end of the arbor to a stepper motor; and
   driving the arbor with the stepper motor.

10. The method of claim 8, further comprising:
    positioning the circuit board on a transfer table;
    moving the transfer table to arrange the end of the arbor proximate to the resistor.

11. The method of claim 8, further comprising:
    disposing a tool on the end of the arbor; and
    positioning a portion of the resistor within a slot formed in the tool.

\* \* \* \* \*